United States Patent [19]
Herr

[11] Patent Number: 6,078,517
[45] Date of Patent: Jun. 20, 2000

[54] SUPERCONDUCTING MEMORY CELL WITH DIRECTLY-COUPLED READOUT

[75] Inventor: Quentin P. Herr, Torrance, Calif.

[73] Assignee: TRW Inc., Redondo Beach, Calif.

[21] Appl. No.: 09/206,267

[22] Filed: Dec. 4, 1998

[51] Int. Cl.$^7$ ................................................ G11C 11/44
[52] U.S. Cl. .......................................... 365/160; 365/161
[58] Field of Search .................................... 365/160, 161, 365/162

[56] References Cited

U.S. PATENT DOCUMENTS

| | | | |
|---|---|---|---|
| 4,130,893 | 12/1978 | Henkels | 365/162 |
| 4,280,095 | 7/1981 | Hinton | 324/248 |
| 4,601,015 | 7/1986 | Ishida | 365/162 |
| 5,191,236 | 3/1993 | Ruby | 307/306 |
| 5,227,645 | 7/1993 | Shinada | 257/34 |
| 5,388,068 | 2/1995 | Ghoshal et al. | 365/162 |

OTHER PUBLICATIONS

S. Nagasawa et al: High–frequency Clock Operation of Josephson RAMs, ISEC '97, Extended Abstracts, vol. 2, pp. 292–290 [sic].

S. Tahara et al: Experimental vortex transitional nondestrcutive read–out Josephson memory cell, J. Appl. Phys 65 (2), Jan. 15, 1989, pp. 851–856.

*Primary Examiner*—David Nelms
*Assistant Examiner*—M. Tran
*Attorney, Agent, or Firm*—Michael S. Yatsko

[57] ABSTRACT

A superconducting cell (10) is provided which has a storage loop (12), a read-out loop (14), and a direct coupling element between the storage loop (12) and read-out loop (14). The direct coupling element is preferably an inductor (30) common to the storage loop (12) and read-out loop (14). The superconducting cell (10) is preferably a vortex-transitional superconducting memory cell. In the superconducting cell (10) a first address line (18) is directly connected to the storage loop (12) and a second address line (16) is electromagnetically coupled to the storage loop (12). The storage loop (12) has a first switchable storage element (20) to switch the superconducting cell (10) into the storing state, when currents on the first and second address lines (18), (16) have the same polarity, and into the reading state, when currents on the first and second address lines (18), (16) have different polarity. The storage loop (12) also has a second switchable storage element (22) for stored binary information to be output on the first address line (18). The plurality of the superconducting cells (10) with direct coupling may be arranged in columns and rows to form a memory array or a crossbar switch.

16 Claims, 3 Drawing Sheets

SUPERCONDUCTING MEMORY CELL WITH DIRECTLY-COUPLED READOUT

This invention was made with United States Government support under Contracts No. F04606-95-0069 for ATSP-Superconductive Crossbar Components, awarded by the Department of the Air Force. The United States Government has certain rights to this invention.

BACKGROUND OF THE INVENTION

1. Field of the Invention

The present invention relates generally to the field of superconducting devices such as memory cells, and more particularly to vortex-transitional (VT) superconducting memory cells.

2. Description of the Related Prior Art

Integrated circuits, such as memory arrays, should be as dense as possible and operate at high speeds. Josephson effect, discovered in 1962, can be used to make extremely fast electronic switches, generally referred to as Josephson junctions. Josephson junctions are made of superconducting material. In addition to their short switching time, Josephson junctions also have very low energy dissipation.

Various Josephson junction technologies made with low Tc materials (such as Nb, Sn, Pb), have been studied for point contact junctions, bridge junctions, micro-bridge junctions, and junctions with variation in thickness. Despite outstanding characteristic properties of these Josephson junction devices of low Tc materials, such as extremely high operating speed, low power dissipation, and high sensitivity for magnetic field detection, they are often considered to be impractical for certain applications because the low Tc superconductor starts superconducting only at an extremely low temperature close to the liquid helium temperature (4.2° K.). NbN is a low-Tc material with an operating temperature of 10° K.

However, with a recent discovery of superconductivity at high superconducting transition temperatures, in oxide superconductors which have their transition temperature higher than the temperature of liquid nitrogen, it is possible to manufacture practical superconducting devices made of such material. The discovery of $La_{2-x}Sr_xCuO_4$ type oxides with Tc close to 30° K. and $Yba_2Cu_3O_{7-y}$ type oxides with Tc close to 90° K. has made it possible to make Josephson junctions which have much more convenient working temperatures, in the region of the temperature of liquid nitrogen (77° K.).

Josephson junction made of high Tc material, commonly described as a weak link, is a tiny barrier separating two superconductors, and may be a dielectric barrier in the order of thickness of 50 A°, a tiny constriction, or a point contact. It is particularly usable for fast switching Josephson devices, such as memory cells. A highly used Josephson device is the single junction RF superconducting quantum interference device (SQUID). This device is equivalent to a superconducting ring having a single weak link coupled to a resonant circuit driven by a constant current source at a selected RF frequency. Both the Q-factor and the resonant frequency of the circuit are modified by the characteristics of the coupling to the SQUID, and dependent upon the magnetic flux through the ring.

The other highly used Josephson device is the two-junction DC SQUID in which a superconducting loop incorporates two Josephson junctions in parallel. For the DC SQUID, the maximum supercurrent across the device, the critical current Ic, is a periodic function of the magnetic flux enclosed in the superconducting loop. A DC SQUID is usually operated in a resistive mode at constant current, in which the total current is due in part to superconducting electrons and in part to normal electrons.

Josephson junctions are the basic constituent elements of numerous complex superconducting electronic devices and circuits, such as data switches, A/D converters, SQUIDS, mixers, correlators, and ultra high performance computing devices. Josephson computers use Josephson devices because of their high intrinsic switching speed and low power dissipation. Josephson devices may have other, distinct components, such as resistors, conductors, transmission lines, inductors, and capacitors, some or all of which may be made of superconducting materials.

Josephson computers preferably use superconducting Josephson Random Access Memory (RAM) architecture. In the hold state this type of RAM provides sub-nanosecond access time and zero power dissipation. The central component of the superconductive Josephson random access memory architecture is a superconducting memory cell, such as a non-destructive read-out (NDRO) latch device. The most efficient and successful conventional Josephson NDRO latch device is the Vortex Transitional (VT) memory cell, which consists of two distinct parts: the storage stage and the read-out stage, as shown in FIG. 1. In general, VT memory cell is a single flux quantum vortex transitional non-destructive read-out Josephson memory cell in which the magnetic field entering a sensing gate increases abruptly, and there is a vortex transition occurring in the sensing stage loop. The storage stage loop stores a persistent circulating current corresponding to a single flux quantum.

FIG. 1 is a schematic diagram of an exemplary conventional vortex transitional memory cell with transformer coupling between its storage 5 and read-out 6 loop and a SQUID in the read-out loop. Josephson junctions 1–4 are represented by character "X". The loops 5, 6 are operated in a current bias or resistive mode and are connected by a transformer coupling element 7. The memory cell data, saved in the storage loop 5 during the storage operation, represents binary information characterized by the presence (digital "1") or absence (digital "0") of a single quantum of magnetic flux. The "1" state corresponds to the presence of a small persistent current circulating in the superconducting storage loop 5. The read-out loop 6 utilizes a two-junction superconducting quantum interference device (SQUID).

Some conventional VT memory cells with NDRO circuit design are described in U.S. Pat. Nos. 4,130,893 and 4,601,015, in the article by W. H. Henkels entitled "Fundamental Criteria for the Design of High-Performance Josephson Nondestructive Readout Random Access Memory Cells and Experimental Confirmation", published in J. Appl. Phys., 50 (12), December 1979, pp. 8143–8168, in the article by S. Tahara et al. entitled "Experimental Vortex Transitional Nondestructive Read-Out Josephson Memory Cell", published in J. Appl. Phys. 65 (2), pp. 851–856 (Jan. 15, 1989), and in the article "High-Frequency Clock Operation in Josephson RAMs" by S. Nagasawa et al., published in Extended Abstracts, Vol 2, pp. 292–290[sic], ISEC '97.

In the devices described in these patents and articles the storage and the read-out stages of the memory cell are physically separate, and coupled magnetically via transformer coupling. However, it is well known in the art that transformer coupling limits circuit performance and operating margins, because coupling efficiency is generally only about 50%. Moreover, a specialized fabrication process is required to produce an integrated circuit with a transformer coupling element, especially when the transformer coupling element should have a high coupling efficiency.

Therefore, there is a need for an efficient superconducting cell which may be used as an element of a memory array and does not require a specialized fabrication process.

SUMMARY OF THE INVENTION

The preceding and other shortcomings of prior art are addressed and overcome by various embodiments of the present invention, which include a superconducting cell with direct coupling element.

One embodiment of the present invention is a superconducting cell having a superconductive storage loop for storing binary information, a read-out loop, and a direct coupling element between the storage loop and the read-out loop. The direct coupling element is preferably an inductor common to the storage loop and the read-out loop. The superconducting cell is preferably a vortex-transitional superconducting memory cell.

The storage loop is directly connected to a first address line and electromagnetically coupled to a second address line. Currents on the first and second address lines have the same polarity, and into the reading state, when currents on the first and second address lines have different polarity. The storage loop also has a second switchable storage element, which, in the reading state, causes the current through the direct coupling element to pass to the read-out loop, for the stored binary information to be output on the first address line.

In another embodiment of the present invention a plurality of the superconductive cells with direct coupling are arranged in columns and rows to form a memory array.

The foregoing and additional features and advantages of the present invention will become further apparent from the following detailed description and accompanying drawing figures that follow. In the figures and written description, numerals indicate the various features of the invention, like numerals referring to like features, throughout for the drawing figures and the written description.

DETAILED DESCRIPTION OF THE INVENTION

The following description is provided to enable any person skilled in the art to make and use the invention and sets forth the best modes contemplated by the inventor of carrying out his invention. Various modifications, however, will remain readily apparent to those skilled in the art, since the general principles of the present invention have been defined herein with specificity.

The present invention relates to an improved superconducting cell, preferably a vortex-transitional superconducting memory cell, which includes direct coupling between its storage stage and read-out stage. This provides a circuit with extremely high operating speed, high sensitivity of magnetic field detection, and very low energy and power dissipation.

Figure 1:
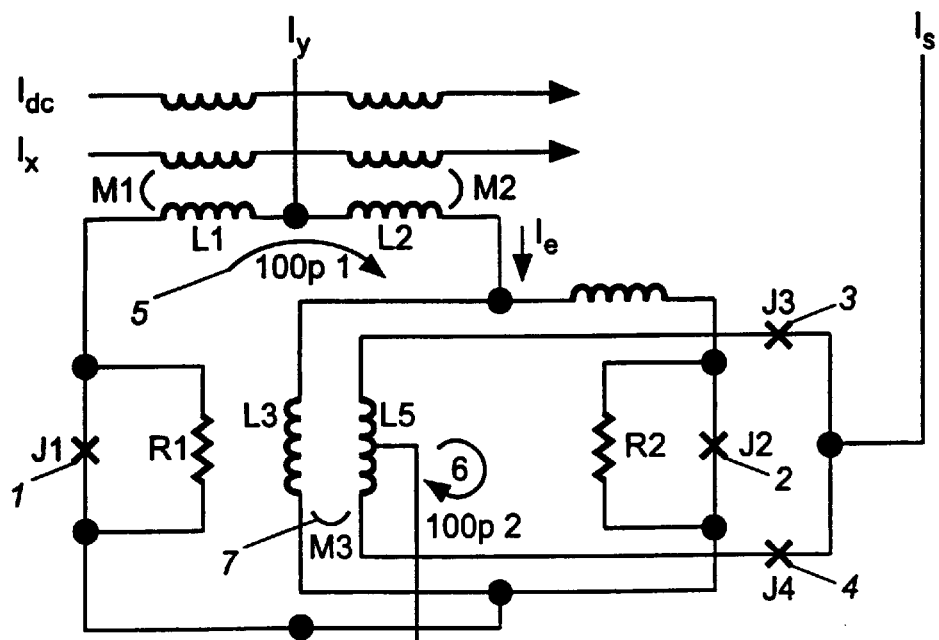
FIG. 1 is a schematic diagram of a conventional vortex transitional memory cell with transformer coupling, according to the prior art.
Figure 2:
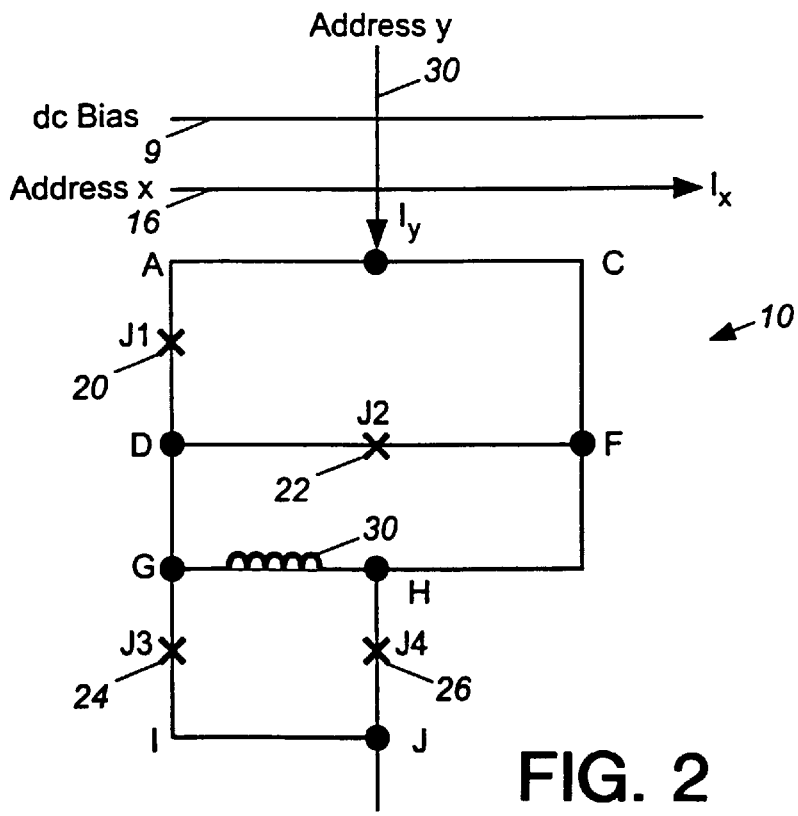
FIG. 2 is a simplified schematic diagram of a superconducting cell with direct coupling, according to the present invention.

FIG. 2 is a simplified schematic diagram of a superconducting cell 10 with direct coupling, according to the present invention. The superconducting cell 10 is preferably in the form of a non-destructive read-out (NDRO) vortex-transitional memory cell. It has a storage stage 12 with two Josephson junctions J1 20, J2 22 and a read-out stage 14 which utilizes a superconducting quantum interference device (SQUID) with two sensing elements, preferably Josephson junctions J3 24, J4 26. The superconducting cell 10 uses a direct coupling element between the storage stage 12 and the read-out stage 14. The direct coupling element is preferably an inductor 30 common to the storage stage 12 and the read-out stage 14.

The storage stage 12 of the superconducting cell 10 includes a storage loop ACFD which has the first switchable storage element Josephson junction J1 20 and the second switchable storage element Josephson junction J2 22. The first switchable storage element J1 20 may be in one of the two states, based on the presence or absence of a single flux quantum (SFQ) within the storage loop ACFD. The second switchable storage element J2 22 can also be in one of the two distinct states, based on the presence or absence of a single flux quantum and the magnitude of the current within the storage loop ACFD. Current in the storage loop ACFD, in read-out mode, produces current in a read-out loop ACFHJIG of the read-out stage 14 by means of the inductor 30. Since there is a direct coupling between the storage stage 12 and the read-out stage 14, the current produced in the read-out stage 14 is about twice as large as could be achieved using a conventional VT memory cell with transformer coupling. Thus, the feasibility of fabrication of the direct-coupled superconducting cell 10 of the present invention is greatly improved.

The direct-coupled superconducting cell 10 uses only two signal lines, address-x 16 and address-y 18 signal lines, because read-out signals are carried by the address-y signal line 18. The address-y 18 line is directly connected to the storage loop ACFD of the superconducting cell 10. The address-x 16 line is electromagnetically coupled to the storage loop ACFD of the superconducting cell 10. The address-x 16 and address-y 18 lines are used to manipulate the states of the first switchable storage element J1 20 and the second switchable storage element J2 22 of the storage loop 12.

The read-out loop ACFHJIG is in the present invention directly connected to the storage loop ACFD, and is used for sensing the state of the storage loop ACFD and for imposing an output signal on the address-y 18 line in the read-out mode. The storage stage 12 and read-out stage 14 circuits may be implemented using either latching or non-latching junctions 20, 22, 24, 26. Therefore, the superconducting cell of the present invention may be constructed using any one of the low-temperature or high-temperature superconductive materials.

Figure 3:
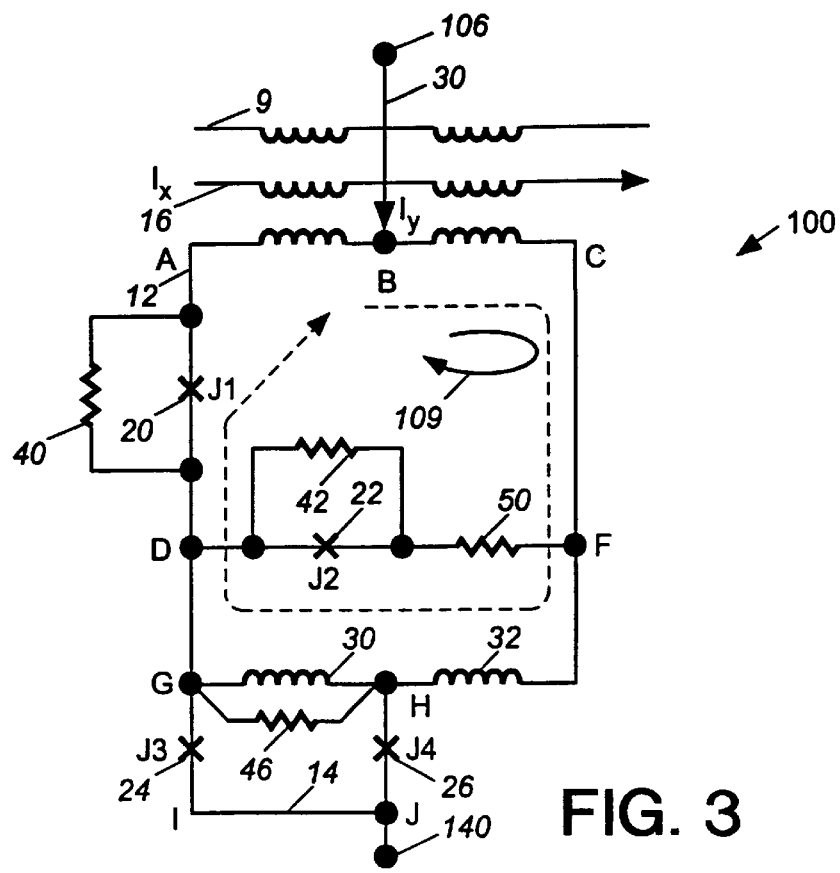
FIG. 3 is a schematic illustration of an exemplary implementation of the superconducting cell with direct coupling of FIG. 2.

FIG. 3 is a schematic illustration of an exemplary implementation of a superconducting cell 100 with direct coupling of FIG. 2. The first and second switchable storage elements 20, 22 and sensing gates 24, 26 are represented by character "X" and are preferably Josephson junctions J1 20, J2 22, J3 24 and J4 26. The read-out stage 14 is preferably a SQUID circuit without timing control signals, which therefore operates at high speeds. Each Josephson junction J1 20, J2 22, J3 24 and J4 26 is a device with a weak-link gap separating superconductors, cooled below the superconducting transition temperature. The weak-link gap may operate in two modes, superconductive mode and resistive mode, which depends on the critical current Ic. Ic is the maximum allowable supercurrent through the device. If there is a current in the device higher than its critical current, the device behaves resistively, and there is a series of one or more voltage spikes, each equal to an SFQ. In superconducting mode, the device represents zero dc impedance and can be used for data storage.

According to FIG. 3, the superconducting cell 100 consists of two superconducting loops, each having two Josephson weak links as in FIG. 2. The address lines are address-x 16 and address-y 18 lines, and there may be an additional control line such as a dc bias 19 line. The address-y line 18 is directly connected to the superconducting cell 100. The address-x 16 and dc bias 19 lines are electromagnetically coupled to the superconducting cell 100. In the hold state the address-x 16 and address-y 18 lines have no current.

To effect write and read operations, the address-x 16 and address-y 18 lines are activated with current pulses with magnitudes of Ix and Iy, respectively, as described below. The optional dc bias line 19 is a control line for shifting the input magnitude level of the current on address-x 16 line between a negative and a positive value. Thus, it has the effect of an offset to the magnitude level of the current on the address-x 16 line, which is used to adjust the positive and negative Ix current magnitude levels, to make the address-x 16 line current values symmetric with respect to zero magnitude level (with different polarities). This effects the binary information stored in the superconducting cell 100, because the current in the storage stage 12 loop ACFD may flow in one of the two opposite senses, in counterclockwise or clockwise direction, and have the same magnitude level.

The two-junction DC SQUID loop, like the read-out loop ACFHJIG of FIGS. 2, 3, incorporates two Josephson junctions J3 24, J4 26 connected in parallel. Critical current Ic is a periodic function of the magnetic flux enclosed in the loop ACFHJIG and the changes in voltage at the exit of the superconducting cell 100 are related to changes in magnetic flux contained within the loop ACFHJIG.

To store (write) data, current pulses of predetermined levels Ix, Iy are together supplied to the address-x 16 and address-y 18 lines, respectively. Currents Ix and Iy on the address-x 16 and address-y 18 lines preferably have negative values. Thereafter, when current pulses supplied to the address-x 16 and address-y 18 lines are cut off, the first Josephson junction J1 20 is in the superconducting state, and thereby sets up and holds a persistent current flowing in the superconducting storage loop ACFD of the storage stage 12. Other Josephson junctions 22, 24 and 26 are not used in store mode.

Thus, to write a binary "1" in store mode, negative current pulses (−Ix and −Iy) are coincidentally applied to the superconducting cell 100 and their combined effect causes the junction J1 20 to switch, diverting all current from the junction J2 22 and admitting a single flux quantum SFQ 109 flow into the storage loop ABCFDA. The SFQ 109 has the form of a persistent current which remains in the storage stage 12 after the address-x 16 and address-y 18 line current magnitude levels return to zero. Referring to FIG. 3, the persistent current is in the counterclockwise (ccw) direction, opposite from the SFQ 109 direction. As long as the superconducting cell 100 is kept at superconducting temperatures, a circulating current will remain set up and store the binary "1" without the application of any power until currents Ix and Iy are affirmatively changed.

To write a binary "0", currents Ix and Iy on the address-x and address-y lines 16,18 have to be positive current pulses. To write a binary "0" in the loop which has stored a binary "1", current pulses +Ix and +Iy are applied together to the storage loop 12, which causes the junction J1 20 to switch in the opposite direction of ccw, i.e., in clockwise direction, thus removing the SFQ 109 from the storage loop 12. The superconducting cell 100 is thus reset and returned to its initial state.

For reading information from the storage loop ACFD, current pulses of predetermined levels Ix, Iy and opposite polarities are coincidentally supplied to address-x 16 and address-y 18 lines, i.e., +Ix, −Iy. If the superconducting cell 100 is in the "0" state, the superconducting cell 100 remains quiescent. If the superconducting cell 100 is in the state with stored digital value "1", the combined effect of currents magnitude levels on address-x 16 and address-y 18 lines, the current persistently flowing in the storage loop ACFD of the storage stage 12 causes the Josephson junction J2 22 to switch. "Switch" meaning to produce a voltage transient equal to one SFQ, then return to the zero-voltage state.

Since in reading mode the polarity of currents on the address-x 16 line and on the address-y 18 line is different, in this mode the total magnitude level of the sum of Ix and Iy signal magnitudes is higher than in mode for storing the digital value "1", when both Ix and Iy are negative. This lets more current to flow in the storage loop ACFD, and the critical current Ic of junction J2 22 is exceeded, causing the junction to switch. Therefore, SFQ 109 is admitted into the loop ABCFHGDA in ccw orientation and current flows through the inductor 30 and an additional inductor 32. Because the junction J2 22 is in conducting mode and letting the current go through the inductors 30, 32 of the loop 113, shown in FIG. 3 with a dashed line, the SFQ 109 is now coupled to the read-out loop 14, which includes sensing gates 24, 26. The sensing gates 24, 26 are preferably formed of Josephson junctions J3 24 and J4 26.

When the current flows through the inductor 30, the sensing gates J3 24 and J4 26 let the stored digital value "1" be read out. The current through the inductor 30, between points H and G of FIG. 3, is divided between two parallel branches, the HG branch and the HJIG branch. In this situation, the junctions J3 24 and J4 26 alternately switch. This alternate switching is very fast and continuous, and causes a dc voltage across the junctions J3 24 and J4 26. If the junctions J3 24 and J4 26 are hysteric, this corresponds to the latched state. Therefore, voltage across the superconducting cell 100 on the address-y 18 line between its entering point 106 and exiting point 140 outside of the read-out loop 14 will register as an increased voltage, as reduced current, or both, and is sensed by a memory detector, not shown. If this is a non-destructive memory cell which does not change the stored information during read operation, after the read-out the current pulses on the address-x 16 and address-y 18 lines are returned to zero, and the superconducting cell 100 keeps the binary "1" state as it was before the read operation occurred.

In the present invention the parameter values for the storage and read-out loop elements cannot be determined analytically, due to a high level of element interdependency in the direct-coupled loops, unlike the conventional VT cell where the storage and read-out stages are independent. Therefore, SPICE simulation was used in order to determine the optimized circuit parameter values of the superconducting cell with direct coupling of the present invention. SPICE is the acronym for the Simulation Program with Integrated Circuit Emphasis, developed by the Electronics Research Laboratory of the University of California and released to the public in 1975.

Figure 4:
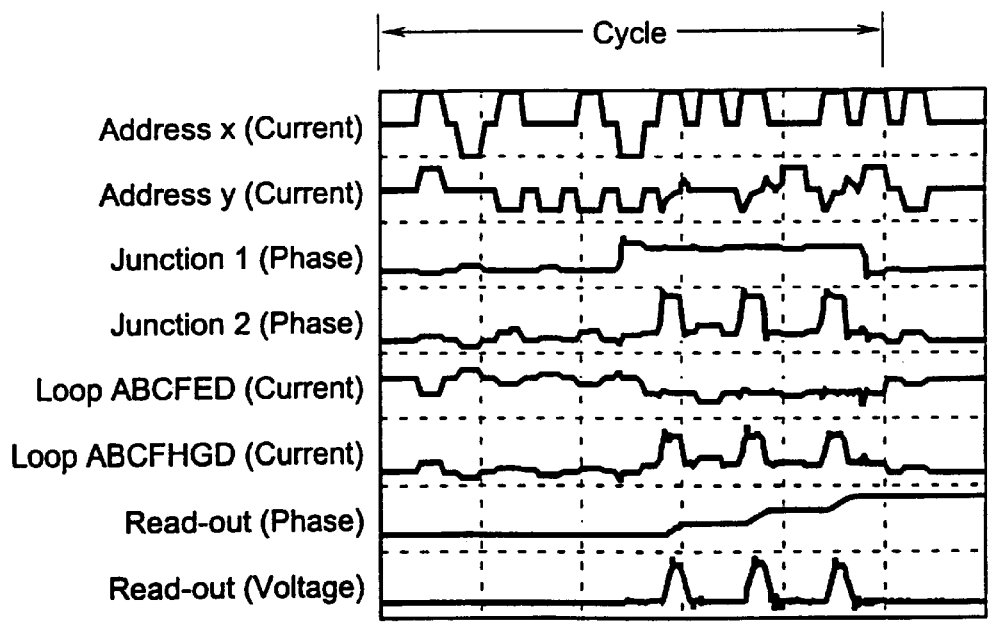
FIG. 4 is an illustration of a timing diagram of test results obtained by simulating performance of the superconducting cell with direct coupling of FIG. 3.

FIG. 4 illustrates the exemplary test results obtained by simulating performance of the superconducting cell with direct coupling of the present invention. In the superconducting cell with direct coupling current magnitude level is on the order of 0.1 mA, which is roughly equal to the critical current Ic of the Josephson junctions used in the superconducting cell with direct coupling. The plots confirm that in the superconducting cell with direct coupling the entire storage stage loop current is directly coupled into the read-out stage loop, and the current Induced in the read-out stage loop is almost twice as large as can be achieved using a conventional memory cell with transformer coupling. This optimizes the linkage between the loops 12 and 14 and reduces current and voltage magnitude levels required in the superconducting cell 100. Therefore, the illustrated device has improved sense margin without the need for increased write margin. Due to the reduced requirement for current and voltage magnitude levels, the direct-coupled superconducting cell 100 thus has improved fabrication yield, lower bit-error-rate, smaller size and cost, and increased wear life of its elements. The results also show the capability for reduced cycle time of the memory operation, thus increasing the speed of the cell.

Figure 5:
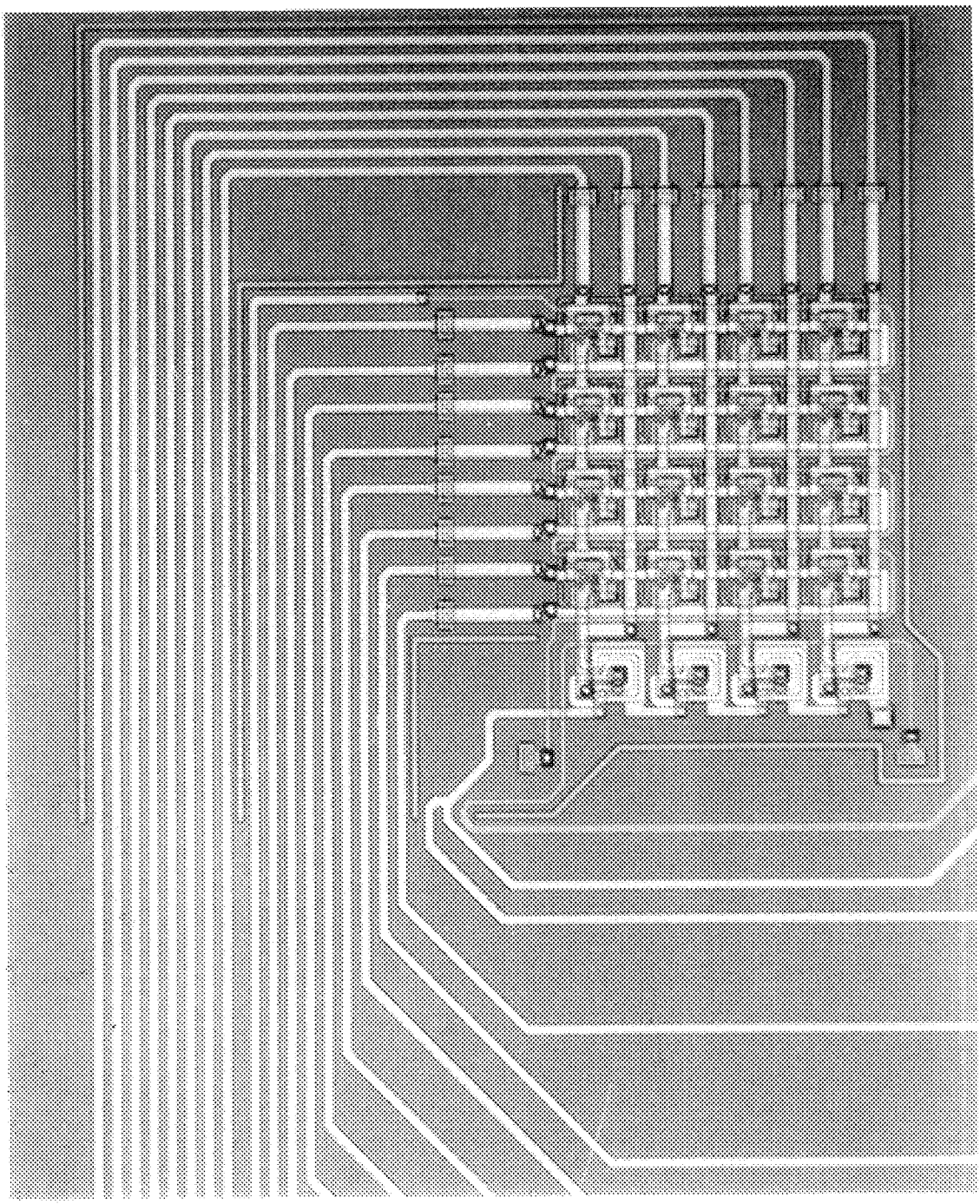
FIG. 5 illustrates an exemplary implementation of the preferred embodiment of the present invention, wherein a plurality of superconducting cells of FIG. 3 are arranged in columns and rows to form a memory array.

FIG. 5 illustrates another embodiment of the present invention implementing a plurality of superconducting cells 100 of FIG. 3, which are arranged in columns and rows to form a superconducting Josephson Random Access Memory (RAM) array. Specifically, FIG. 5 shows a layout of a 4×4 RAM array architecture, having 16 superconducting cells with direct coupling, with each cell having four Josephson junctions. The experiments performed on the illustrated RAM array show that the combined access times during cryogenic operation are well below 1 nanosecond, with zero power dissipation in the hold state. Therefore, such RAM arrays can be used with high-performance computing and signal processing circuits including, but not limited to, Josephson digital circuits. The invention is further usable for numerous other superconductive electronic memory devices such as cash memories, and other high speed devices, such as superconductive crossbar switches, magnetometers and detectors, and wherever else coupling of two loops with Johnson junctions is used.

While this invention has been described with reference to its presently preferred embodiment(s), its scope is only limited insofar as defined by the following set of claims and all equivalents thereof. It is quite clear that the above description has been given purely by way of a non-restrictive example. The digital values have been given purely to illustrate the description. Those skilled in the art will appreciate that various adaptations and modifications of the just-described preferred embodiments can be configured without departing from the scope and spirit of the invention. Therefore, it is to be understood that, within the scope of the appended claims, the invention may be practiced otherwise than as specifically described herein.

What is claimed is:

1. A superconducting cell, comprising:

a superconductive storage loop for storing binary information, said superconducting cell having a storing state for storing binary information and a reading state for reading binary information;

a read-out loop; and a direct coupling means between the storage loop and the read-out loop, with the direct coupling means having an inductor common to the storage loop and the read-out loop;

said storage loop comprising:
a first address line directly connected to the storage loop,
a second address line magnetically coupled storage loop,
a first switchable storage element for switching the superconducting cell into the storing state, when currents on the first and second address lines have same polarity, and into the reading state, when the currents on the first and second address lines have different polarity, and
a second switchable storage element for imposing a reading current through the direct coupling means, and passing the reading current to the read-out loop in the reading state for sensing the stored binary information on the first address line.

2. The device according to claim 1 wherein the superconducting cell is a vortex-transitional superconducting memory cell.

3. The device according to claim 1 further comprising a control line magnetically coupled to the storage loop of the superconducting cell, for shifting the magnitude level of the current on the second address line between a negative and a positive value.

4. The device according to claim 1 wherein each said first and second switchable storage element comprises a Josephson junction of low-temperature superconductive material, connected in parallel to an external resistive shunt.

5. The device according to claim 4 wherein the superconducting cell is non-destructive, and the read-out loop comprises a two-junction superconducting quantum interference device (SQUID), having two sensing gates.

6. The device according to claim 5 wherein the superconducting cell being suitable for use as an element of a memory array.

7. The device according to claim 5 wherein the superconducting cell being suitable for use as an element of a crossbar switch.

8. The device according to claim 1 wherein each said first and second switchable storage element comprises a non-destructive Josephson junction of high-temperature superconductive material, and the read-out loop comprises a two-junction superconducting quantum interference device (SQUID) having two sensing gates.

9. The device according to claim 8 wherein the superconducting cell being suitable for use as an element of a memory array.

10. The device according to claim 8 wherein the superconducting cell being suitable for use as an element of a crossbar switch.

11. A memory array comprising:

a plurality of memory cells arranged in columns and rows;

a plurality of first address lines; and a plurality of second address lines, each said memory cell being attached to one of the plurality of first address lines and one of the plurality of second address lines, with the first address line directly connected to the storage loop in the memory cell and the second address line magnetically coupled to the storage loop for the memory cell, and each said memory cell having:
- a superconductive storage loop for storing binary information in a storing state,
- a read-out loop for reading the stored binary information in a reading state,
- a direct coupling means between the storage loop and the read-out loop, with the direct coupling means having an inductor common to the storage loop and the read-out loop;
- a first switchable storage element for switching the memory cell into the storing state, when currents on the first and second address lines have the same polarity, and into the reading state, when currents on the first and second address lines have different polarity, and
- a second switchable storage element for imposing a reading current through the direct coupling means, and passing the reading current to the read-out loop in the reading state for sensing the stored binary information on the first address line.

12. The device according to claim 11 wherein the superconducting memory cell is a vortex-transitional superconducting memory cell.

13. The device according to claim 11 further comprising a control line magnetically coupled to the memory cell, for shifting the magnitude level of the second address line between a negative and a positive value.

14. The device according to claim 11 wherein each said first and second switchable storage element comprises a Josephson junction of low-temperature superconductive material, connected in parallel to an external resistive shunt.

15. The device according to claim 14 wherein the memory cell is non-destructive and the read-out loop comprises a two-junction superconducting quantum interference device (SQUID).

16. The device according to claim 11 wherein each said first and second switchable storage element comprises a non-destructive Josephson junction of low temperature superconductive material, and the read-out loop comprises a two-junction superconducting quantum interference device (SQUID).

* * * * *